US012774252B2

(12) United States Patent
Matsukura et al.

(10) Patent No.: US 12,774,252 B2
(45) Date of Patent: Oct. 27, 2026

(54) SINTERED BODY

(71) Applicant: MITSUI KINZOKU COMPANY, LIMITED, Tokyo (JP)

(72) Inventors: Kento Matsukura, Omuta (JP); Yoshiaki Tazaki, Omuta (JP); Minami Dan, Omuta (JP)

(73) Assignee: MITSUI KINZOKU COMPANY, LIMITED (JP)

( * ) Notice: Subject to any disclaimer, the term of this patent is extended or adjusted under 35 U.S.C. 154(b) by 593 days.

(21) Appl. No.: 18/266,216

(22) PCT Filed: Dec. 8, 2021

(86) PCT No.: PCT/JP2021/045146

§ 371 (c)(1),
(2) Date: Jun. 8, 2023

(87) PCT Pub. No.: WO2022/163150

PCT Pub. Date: Aug. 4, 2022

(65) Prior Publication Data

US 2023/0391676 A1 Dec. 7, 2023

(30) Foreign Application Priority Data

Jan. 26, 2021 (JP) ................................ 2021-010693

(51) Int. Cl.

| | |
|---|---|
| ***C04B 35/505*** | (2006.01) |
| ***C04B 35/645*** | (2006.01) |
| ***H01J 37/32*** | (2006.01) |

(52) U.S. Cl.

CPC .......... *C04B 35/505* (2013.01); *C04B 35/645* (2013.01); *H01J 37/32495* (2013.01);

(Continued)

(58) Field of Classification Search

CPC .......... C04B 35/505; C04B 2235/5436; C04B 2235/786; C04B 2235/3225; C04B 2235/768; C01F 17/34

See application file for complete search history.

(56) References Cited

U.S. PATENT DOCUMENTS

| | | | |
|---|---|---|---|
| 2003/0049499 | A1 | 3/2003 | Murakawa et al. |
| 2008/0236744 | A1 | 10/2008 | Furuse et al. |

(Continued)

FOREIGN PATENT DOCUMENTS

| | | |
|---|---|---|
| CN | 107074663 A | 8/2017 |
| JP | H08-268751 A | 10/1996 |

(Continued)

OTHER PUBLICATIONS https://www.crytur.com/materials/yap-undoped/ Accessed Feb. 2, 2026 (Year: 2026).*

(Continued)

*Primary Examiner* — Cameron K Miller

(74) *Attorney, Agent, or Firm* — Harness, Dickey & Pierce, P.L.C.

(57) ABSTRACT

A sintered body contains perovskite $YAlO_3$ (YAP) as a main phase exhibited in X-ray diffractometry, and has a Vickers hardness of 11 GPa or more. In the case where the sintered body contains a composition other than $YAlO_3$, the composition preferably substantially consists of $Y_3Al_5O_{12}$ and $Y_4Al_2O_9$. The sintered body preferably has an absolute density of 5.1 g/cm$^3$ or more. The sintered body preferably has an open porosity of 1% or less, and also preferably has an average crystal grain size of 10 μm or less.

7 Claims, 1 Drawing Sheet

Example 1

(52) U.S. Cl.
CPC ................. *C04B 2235/3222* (2013.01); *C04B 2235/5409* (2013.01); *C04B 2235/5436* (2013.01); *C04B 2235/604* (2013.01); *C04B 2235/656* (2013.01); *C04B 2235/666* (2013.01); *C04B 2235/77* (2013.01); *C04B 2235/786* (2013.01); *H01J 2237/0203* (2013.01)

(56) References Cited

U.S. PATENT DOCUMENTS

| | | | |
|---|---|---|---|
| 2013/0299749 A1 | 11/2013 | Tsutsumi et al. | |
| 2017/0305796 A1 | 10/2017 | Yano et al. | |
| 2024/0059616 A1* | 2/2024 | Donelon | C04B 35/62625 |

FOREIGN PATENT DOCUMENTS

| | | |
|---|---|---|
| JP | H11-157916 A | 6/1999 |
| JP | 2000-044235 A | 2/2000 |
| JP | 2006-199562 A | 8/2006 |
| JP | 2013-224226 A | 10/2013 |
| WO | 2020217552 A1 | 10/2020 |

OTHER PUBLICATIONS

Liu Yong et al., "Correlation Between the Body Color of YAlO3 and Its Defect Equilibrium"; Chinese Journal of Inorganic Chimistry; vol. 32, No. 3; Mar. 31, 2026; pp. 491-498 (total 8 pages).
International Search Report (English and Japanese) issued in PCT/JP2021/045146, mailed Janaury 25, 2022; ISA/JP (7 pages).
Kenya Hamano, "Fine Ceramics Handbook," Feb. 10, 1984 (6 pages).
Ranjan Sudhanshu, "Sintering and Mechanical Properties of Alumina-Yttrium Aluminate Composites," Department of Ceramic Engineering, National Institute of Technology, Rourkela, May 2015 (45 pages).

* cited by examiner

Example 1

Comparative Example 3

SINTERED BODY

CROSS REFERENCE TO RELATED APPLICATIONS

This application is a U.S. National Phase application under 35 U.S.C. 371 of International Application No. PCT/JP2021/045146, filed on Dec. 8, 2021, which claims priority to Japanese Patent Application No. 2021-010693, filed on Jan. 26, 2021. The entire disclosures of the above applications are expressly incorporated by reference herein.

BACKGROUND

Technical Field

The present invention relates to a sintered body that is a polycrystalline ceramic containing perovskite $YAlO_3$ (yttrium-aluminum-perovskite, hereinafter also referred to as "YAP").

Related Art

A coating or sintered body made of a highly corrosion-resistant ceramic, such as $Y_2O_3$ or $Al_2O_3$, is used as a protection material in a process for producing semiconductor.

In particular, a yttrium (Y)-containing compound is known to have a high level of chemical plasma resistance. In recent years, high power plasma has been used in equipment for manufacturing fine semiconductors, and accordingly, it is also necessary that the semiconductor-manufacturing equipment should have physical sputter resistance. Thus attention is paid to $Y_3Al_5O_{12}$, which is a composite oxide of yttrium and aluminum with a garnet structure (yttrium-aluminum-garnet, hereinafter also referred to as "YAG") and has high hardness. As other composite oxides of yttrium and aluminum, perovskite $YAlO_3$ (YAP) and monoclinic $Y_4Al_2O_9$ (yttrium-aluminum-monoclinic, hereinafter also referred to as "YAM") are also known.

For example, US 2008/0236744A discloses a plasma etching equipment, and discloses that a material sprayed to a wall member inside a plasma processing equipment is composed of one or more of $Al_2O_3$, YAG, $Y_2O_3$, $Gd_2O_3$, $Yb_2O_3$, and $YF_3$, and that a conductor is incorporated into the sprayed material.

JP 2006-199562A discloses a corrosion-resistant member that is a sintered body containing, as metal elements, 70 to 98 mass % of aluminum (Al) in terms of $Al_2O_3$ and 2 to 30 mass % of yttrium (Y) in terms of $Y_2O_3$, and having $Al_2O_3$ or YAG crystal as the main crystal, wherein at least particles of the YAG crystal in the surface of the corrosion-resistant member that is to be exposed to a halogen element-containing corrosive gas or a plasma thereof have a wedge shape.

US 2003/0049499A1 discloses a corrosion-resistant member having a portion that is to be exposed to a chlorine-based corrosive gas or a plasma thereof, wherein the portion is made of a composite oxide containing a metal of Group IIIA of the periodic table and Al and/or Si. US 2003/0049499A1 discloses $YAlO_3$ (YAP) in examples thereof.

SUDHANSHU RANJAN, "SINTERING AND MECHANICAL PROPERTIES OF ALUMINA-YTTRIUM ALUMINATE COMPOSITES", DEPARTMENT OF CERAMIC ENGINEERING, NATIONAL INSTITUTE OF TECHNOLOGY Rourkela, A THESIS SUBMITTED IN PARTIAL FULFILMENT OF THE REQUIREMENT FOR THE DEGREE of Master of Technology in INDUSTRIAL CERAMICS, May, 2015, pp. 1-35 discloses a method for producing a composite oxide of yttrium and aluminum used as a raw material, and the characteristics of a sintered body obtained by sintering a molded body made of the raw material.

As can be seen from US 2008/0236744A, $Al_2O_3$, $Y_2O_3$, or garnet-type $Y_3Al_5O_{12}$ (YAG), which is a composite oxide of yttrium and aluminum, has been studied as a corrosion-resistant material for use in plasma etching equipment. $Y_2O_3$ has a higher level of corrosion resistance to halogen-based plasma than $Al_2O_3$, but it cannot be said that the hardness of $Y_2O_3$ is sufficient. On the other hand, as disclosed in JP 2006-199562A and SINTERING AND MECHANICAL PROPERTIES OF ALUMINA-YTTRIUM ALUMINATE COMPOSITES, it has been recognized that YAG, which is a composite oxide of yttrium and aluminum, is a component that tends to easily provide both hardness and corrosion resistance.

On the other hand, as for perovskite $YAlO_3$ (YAP), which is a composite oxide of yttrium and aluminum as with YAG, US 2003/0049499A1 discloses evaluation for plasma resistance of sintered bodies produced by sintering molded bodies made of a mixture of $Al_2O_3$ and $Y_2O_3$ to cause a reaction. However, the composition and the physical properties of the sintered bodies are not clearly disclosed.

Furthermore, the inventors of the present application have conducted studies and, as a result, have found that the $Y_2O_3$ sintered bodies, the YAG sintered bodies, and the sintered bodies obtained using the method disclosed in US 2003/0049499A1 are not sufficient in terms of thermal shock resistance.

It is an object of the present invention to solve the problems of the conventional techniques described above, and, specifically, to provide a sintered body that has an excellent level of thermal shock resistance by using YAP, which contains a larger amount of yttrium (Y) component than YAG and thus can improve resistance to halogen-based plasma as compared with YAG.

SUMMARY

The present invention provides a sintered body containing perovskite $YAlO_3$ (YAP) as a main phase, wherein the sintered body has a Vickers hardness of 11 GPa or more.

Also, the present invention provides a method for producing the above-described sintered body, the method including the steps of: preparing a molded body made of a raw material powder that contains perovskite $YAlO_3$ and has an average particle size of 1 μm or less; and sintering the molded body at a temperature of 1200° C. or more and 1700° C. or less under a pressure of 5 MPa or more and 100 MPa or less to obtain the sintered body.

Also, the present invention provides another method for producing the above-described sintered body, the method including the steps of: preparing a molded body made of a raw material powder that contains perovskite $YAlO_3$ and has an average particle size of 1 μm or less; and sintering the molded body at a temperature of 1400° C. or more and 1900° C. or less without applying a pressure.

Also, the present invention provides a plasma-resistant member having a surface that is to be exposed to plasma in a halogen-based corrosive gas atmosphere, wherein the above-described sintered body provides said surface.

DETAILED DESCRIPTION

Figure 1:
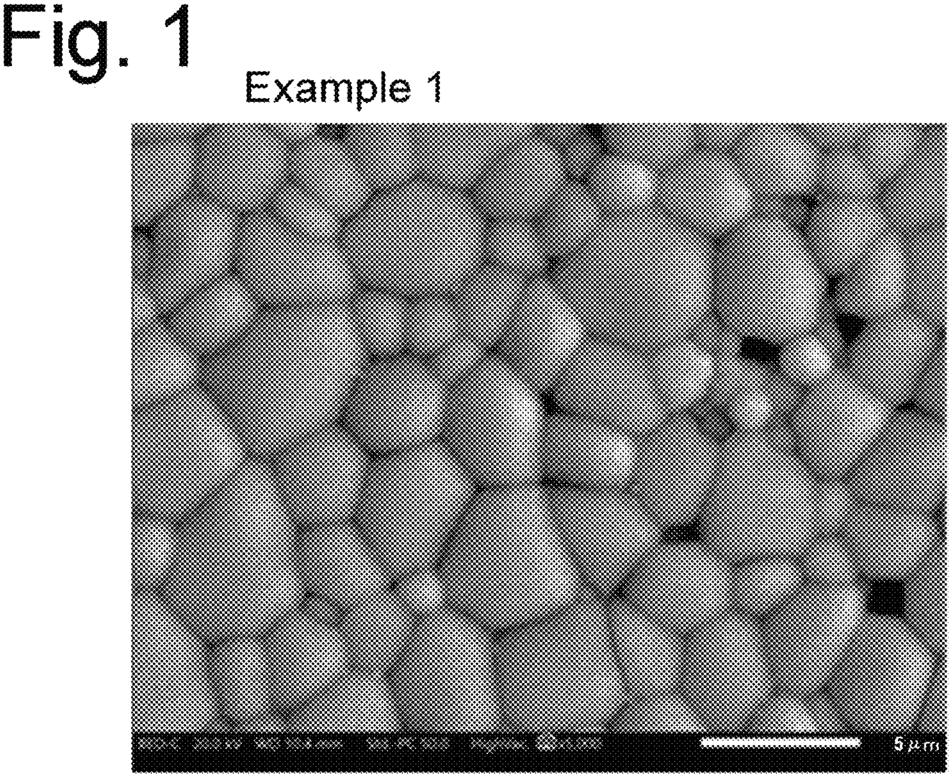
FIG. 1 is a scanning electron microscope image of a sintered body obtained in Example 1.

Hereinafter, the present invention will be described based on preferred embodiments thereof. The sintered body according to the present invention is a polycrystalline ceramic sintered body.

The inventors of the present application have found that a sintered body containing YAP and having high hardness has excellent characteristics in terms of thermal shock resistance. Accordingly, the sintered body of the present invention can be used as, for example, a component for use in an environment at a temperature at which it is difficult to use a conventional highly plasma-resistant sintered body with a Y—O bond (YAP, $Y_2O_3$, YAG, or the like), and thus the sintered body of the present invention can be used as a corrosion-resistant member in a wider range of application than a conventional sintered body. Herein, the term "plasma-resistant" and derivatives thereof refer to being corrosion-resistant to plasma, and may also be referred to as "anti-plasma" or "anti-plasma corrosion".

Composition of Sintered Body

When the sintered body of the present invention is subjected to X-ray diffractometry, diffraction peaks assigned to $YAlO_3$ are exhibited. The sintered body of the present invention exhibits a high level of corrosion resistance during plasma etching with a halogen-based gas. There are known two phases of $YAlO_3$, i.e., a cubic crystal phase and an orthorhombic crystal phase. The sintered body of the present invention exhibits diffraction peaks assigned to $YAlO_3$ of an orthorhombic crystal phase, among the two phases. In this case, there is provided high stability in plasma etching with a halogen-based gas.

The sintered body of the present invention contains perovskite $YAlO_3$ as the main phase. The fact that the sintered body of the present invention contains perovskite $YAlO_3$ as the main phase can be confirmed by performing X-ray diffractometry in a scan range $2\theta=20°$ to $60°$ to check that the peak with the maximum peak height is assigned to perovskite $YAlO_3$. Hereinafter, the term "X-ray diffractometry" refers to X-ray diffractometry performed in the above-described scan range, unless otherwise noted. In particular, among the peaks exhibited in X-ray diffractometry on the sintered body of the present invention, a peak assigned to the (112) plane of orthorhombic $YAlO_3$ preferably has the maximum peak intensity. The sintered body of the present invention may contain a crystal phase other than $YAlO_3$. However, in the case where the sintered body of the present invention contains a crystal phase other than $YAlO_3$, it is preferable that the other crystal phase should be substantially consists of $Y_3Al_5O_{12}$ crystal phase and/or $Y_4Al_2O_9$ crystal phase, in view of preventing a reduction in the mechanical strength of the sintered body due to the presence of $Al_2O_3$ or $Y_2O_3$ and reducing the generation of particles during irradiation with a halogen-based plasma.

The fact that the crystal phase other than $YAlO_3$ in the sintered body of the present invention is substantially consists of $Y_3Al_5O_{12}$ and/or $Y_4Al_2O_9$ means that, when the sintered body is subjected to X-ray diffractometry, the maximum peak assigned to a component other than $YAlO_3$, $Y_3Al_5O_{12}$, or $Y_4Al_2O_9$ has a relative peak height of preferably 10 or less, more preferably 5 or less, and even more preferably 1 or less, to the peak height of a peak assigned to the (112) plane of orthorhombic $YAlO_3$, which is regarded as 100. It is particularly preferable that peaks other than that assigned to $YAlO_3$, $Y_3Al_5O_{12}$, or $Y_4Al_2O_9$ should not be exhibited.

It is preferable that in X-ray diffractometry of the sintered body of the present invention, peaks assigned to alumina phase should not be exhibited, or should be very small, if any, in view of increasing the corrosion resistance to plasma etching with a halogen-based gas. In the case where peaks assigned to trigonal $Al_2O_3$ are exhibited in addition to peaks assigned to orthorhombic $YAlO_3$ in X-ray diffractometry of the sintered body of the present invention, the value of the ratio of S2 to S1, S2/S1, is preferably 0.1 or less, more preferably 0.05 or less, and even more preferably 0.01 or less, where S1 represents the intensity of the peak assigned to the (112) plane of orthorhombic $YAlO_3$ and S2 represents the intensity of the peak assigned to the (104) plane of trigonal $Al_2O_3$. It is most preferable that the peak assigned to the (104) plane of trigonal $Al_2O_3$ should not be exhibited. Herein, a ratio between peak intensities refers to the ratio between peak heights, and not the ratio between integrated intensities of peaks.

The sintered body of the present invention may contain, as the crystal phase other than $YAlO_3$, substantially consists of $Y_3Al_5O_{12}$ and/or $Y_4Al_2O_9$, as described above, and in this case, when peaks assigned to cubic crystal $Y_3Al_5O_{12}$ or peaks assigned to monoclinic crystal $Y_4Al_2O_9$ are exhibited in addition to the peaks assigned to orthorhombic $YAlO_3$ in X-ray diffractometry of the sintered body of the present invention using CuKα rays, the value of the ratio of S3 to S1, S3/S1, and the value of the ratio of S4 to S1, S4/S1, are each independently preferably less than 1, where S1 represents the intensity of the peak assigned to the (112) plane of orthorhombic $YAlO_3$, S3 represents the intensity of the peak assigned to the (420) plane of cubic crystal $Y_3Al_5O_{12}$, and S4 represents the intensity of the peak assigned to the (−221) plane of monoclinic crystal $Y_4Al_2O_9$. The reason for this is as follows: (a) since orthorhombic $YAlO_3$ has the highest density among composite oxides of yttrium and aluminum, the sintered body of the present invention having the ratio as described above has a high level of hardness and a high level of physical etching resistance; and (b) orthorhombic $YAlO_3$ is a composition that contains a larger amount of yttrium component, which is known to have a high level of halogen-based plasma resistance, as compared with a single composition of cubic crystal $Y_3Al_5O_{12}$, which also has a high level of hardness.

In view of further increasing the corrosion resistance to plasma etching with a halogen-based gas, S3/S1 and S4/S1 each independently are preferably 0.7 or less, more preferably 0.4 or less, and even more preferably 0.1 or less. It is most preferable that the peak assigned to the (420) plane of cubic crystal $Y_3Al_5O_{12}$ or the peak assigned to the (−221) plane of monoclinic crystal $Y_4Al_2O_9$ should not be exhibited.

The sintered body of the present invention preferably contains no $Y_2O_3$ or only a very small amount of $Y_2O_3$, if any, in view of increasing the mechanical strength of the sintered body and sufficiently exhibiting the corrosion resistance to halogen-based plasma. From this viewpoint, the ratio of S5 to S1, S5/S1, is preferably 0.1 or less, where S1 represents the intensity of the peak assigned to the (112) plane of orthorhombic $YAlO_3$ and S5 represents the intensity of the peak assigned to the (222) plane of cubic crystal $Y_2O_3$, in X-ray diffractometry of the sintered body of the present invention using CuKα rays.

In view of even further increasing the corrosion resistance to plasma etching with a halogen-based gas and the mechanical strength of the sintered body, S5/S1 is preferably 0.05 or less, more preferably 0.01 or less, and even more preferably less than 0.01. It is most preferable that the peak assigned to the (222) plane of cubic crystal $Y_2O_3$ should not be exhibited.

In the X-ray diffractometry using CuKα rays, the peak assigned to the (112) plane of orthorhombic $YAlO_3$ is exhibited at or around 2θ=34°. Specifically, the peak assigned to the (112) plane of orthorhombic $YAlO_3$ is exhibited in a range of 2θ=34.3°±0.15°.

In the X-ray diffractometry using CuKα rays, the peak assigned to the (104) plane of trigonal $Al_2O_3$ is usually exhibited at 2θ=35°. Specifically, the peak assigned to the (104) plane of trigonal $Al_2O_3$ is exhibited in a range of 35.2°+0.15°.

In the X-ray diffractometry using CuKα rays, the peak assigned to the (420) plane of cubic crystal $Y_3AlO_{12}$ is usually exhibited at or around 2θ=33°. Specifically, the peak assigned to the (420) plane of cubic crystal $Y_3Al_5O_{12}$ is exhibited in a range of 33.3°±0.15°.

In the X-ray diffractometry using CuKα rays, the peak assigned to the (−221) plane of monoclinic crystal $Y_4Al_2O_9$ is usually exhibited at or around 2θ=30°. Specifically, the peak assigned to the (−221) plane of monoclinic crystal $Y_4Al_2O_9$ is exhibited in a range of 29.6°±0.15°.

In the X-ray diffractometry using CuKα rays, the peak assigned to the (222) plane of cubic crystal $Y_2O_3$ is usually exhibited at or around 2θ=29°. Specifically, the peak assigned to the (222) plane of cubic crystal $Y_2O_3$ is exhibited in a range of 29.2°±0.15°.

Usually, the sintered body of the present invention does not contain $YAlO_3$ phase other than perovskite orthorhombic $YAlO_3$, $Y_3Al_5O_{12}$ phase other than cubic crystal $Y_3Al_5O_{12}$, $Y_4Al_2O_9$ phase other than monoclinic crystal $Y_4Al_2O_9$, $Al_2O_3$ phase other than trigonal $Al_2O_3$, or $Y_2O_3$ phase other than cubic crystal $Y_2O_3$: however, if any, the peak relative heights of the maximum peaks assigned to these crystal phases in a scan range of 2θ=20° to 60° are each independently preferably 5 or less, more preferably 1 or less, and even more preferably 0.5 or less, to the peak height of the peak assigned to the (112) plane of orthorhombic $YAlO_3$, which is regarded as 100. It is most preferable that the peaks assigned to these crystal phases should not be exhibited.

Vickers Hardness

The inventors of the present application have surprisingly found that, when a perovskite $YAlO_3$ sintered body has a Vickers hardness greater than or equal to a specific value, the sintered body has an excellent level of thermal shock resistance. The sintered body of the present invention has a Vickers hardness of 11 GPa or more. Although the reasons that the sintered body having a Vickers hardness within the above-described range has an increased level of thermal shock resistance are not clear, one of the reasons is probably as follows: a sintered body having a high level of hardness is unlikely to undergo plastic deformation; the tolerance to accumulation of dislocation at crystal interfaces is large in such a sintered body; and, as a result of these, the tolerance to thermal stress is also large with respect to thermal shock. The perovskite $YAlO_3$ sintered body having a Vickers hardness greater than or equal to a predetermined value also has an excellent level of corrosion resistance to halogen-based plasma. The sintered body of the present invention preferably has a Vickers hardness of 12 GPa or more, and more preferably 13 GPa or more. The greater Vickers hardness, the more preferable. However, in view of ease of producing the sintered body, the Vickers hardness is even more preferably 17 GPa or less, and yet even more preferably 16 GPa or less.

The Vickers hardness can be measured using a method described in Examples given below.

The perovskite $YAlO_3$ sintered body having a Vickers hardness within the above-described range can be obtained by producing the sintered body of the present invention using a production method, which will be described later.

Density

The sintered body of the present invention has a high level of absolute density because it is a dense perovskite $YAlO_3$ sintered body. The sintered body having a high level of density can exhibit a high level of halogen-based corrosive gas blocking properties. The sintered body of the present invention is highly dense and has an excellent level of halogen-based corrosive gas blocking properties, and thus, when the sintered body of the present invention is used, for example, as a constituent member of semiconductor equipment, it is possible to prevent a halogen-based corrosive gas from flowing into the constituent member. Thus, the sintered body of the present invention has a high level of performance to prevent corrosion caused by the halogen-based corrosive gas. Such a member having a high level of halogen-based corrosive gas blocking properties as described above can be suitably used, for example, as a member of a vacuum chamber, an etching gas supply inlet, a focus ring, a wafer holder, or the like, of etch equipment. In view of densifying the sintered body of the present invention even more, the sintered body has a density of preferably 5.1 $g/cm^3$ or more, more preferably 5.2 $g/cm^3$ or more, and even more preferably 5.3 $g/cm^3$ or more.

Open Porosity

In view of improving the corrosion resistance, the porosity, in particular, the open porosity (OP), is preferably a smaller value. The open porosity can be determined using a method described below, and is preferably 1% or less, more preferably 0.1% or less, and even more preferably 0.01% or less.

The sintered body having a density and an open porosity (OP) within the above-described respective ranges can be obtained by adjusting the temperature condition and the pressure condition when the sintered body of the present invention is produced using the production method described below.

Average Crystal Grain Size

The sintered body of the present invention preferably has a small average crystal grain size because of the following: a small crystal grain size results in a smooth surface of the sintered body even when particles in the surface of the sintered body come off therefrom, and thus the processability and the yield upon processing can be improved. The sintered body of the present invention preferably has an average crystal grain size of 10 μm or less, more preferably 9 μm or less, and even more preferably 8 μm or less. The average crystal grain size of the sintered body is preferably 1 μm or more because such a size means progression of sintering and therefore a high level of the strength of the sintered body. The sintered body having an average crystal grain size within the above-described range can be obtained by adjusting the particle size of raw material, the molding condition, and the sintering condition in the preferred method for producing the sintered body, which will be described later. The average crystal grain size of the sintered body can be measured using a method described in Examples, which will be described later.

Production Method

Next, a preferred method for producing the sintered body of the present invention will be described. The preferred method may be production method 1 or production method 2 described below.

The method includes the step of preparing a molded body made of a raw material powder that contains $YAlO_3$ and has an average particle size of 1 μm or less (hereinafter also referred to as "molding step"); and sintering step 1 or sintering step 2 of sintering the molded body as described below. In the case where sintering step 2 is used, the pressure applied in the molding step is preferably 20 MPa or more and 200 MPa or less.

Sintering step 1: sintering the molded body at a temperature of 1200° C. or more and 1700° C. or less under a pressure of 5 MPa or more and 100 MPa or less (hereinafter also referred to as "sintering step 1").

Sintering step 2: sintering the molded body at a temperature of 1400° C. or more and 1900° C. or less without applying a pressure.

Raw Material Powder

The raw material powder used in the molding step has an average particle size $D_{50}$ of 1 μm or less and contains $YAlO_3$. The raw material powder preferably has a composition containing perovskite $YAlO_3$ as the main phase.

The inventors of the present application have found that when a raw material powder having an average particle size $D_{50}$ of 1 μm or less and containing $YAlO_3$, preferably perovskite $YAlO_3$, as the main phase, the resulting sintered body is advantageous in terms of the following two points of view. First, the true density of the raw material powder is high, and thus the density of a molded body made of the raw material powder can also be high. More specifically, the difference between the density of the resulting molded body and the theoretical density after sintering is reduced, and as a result, formation of pores, which are gaps between grains (particles), can be suppressed to produce a sintered body having a high level of density and a high level of hardness. Secondly, a problem arises when using a mixed powder of $Al_2O_3$ and $Y_2O_3$ instead of a raw material powder containing $YAlO_3$, and the problem is specifically that some of $Al_2O_3$ and $Y_2O_3$ are likely to remain in the resulting sintered body, which easily leads to decrease in the mechanical strength and the corrosion resistance to halogen-based gas. The reason for this is probably as follows: when a mixed powder of $Al_2O_3$ and $Y_2O_3$ is used, there is a difference between the particle size of $Al_2O_3$ particles and the particle size of $Y_2O_3$ particles during reaction sintering, and also, it is difficult to avoid a nonuniform distribution of adjacent particles in the molded body. In contrast, in the production method of the present invention, a precursor of a sintered body contains $YAlO_3$, and preferably contains perovskite $YAlO_3$ as the main phase, and accordingly, $Al_2O_3$ and $Y_2O_3$ are unlikely to remain in the resulting sintered body.

As described above, the expression "contain perovskite $YAlO_3$ as the main phase" in X-ray diffractometry using CuKα rays means that a peak with a maximum peak height exhibited in the X-ray diffractometry is assigned to orthorhombic $YAlO_3$. As described above, the scan range is $2\theta=20°$ to 60°.

As described above, the $YAlO_3$-containing particles of the raw material powder have an average particle size $D_{50}$ of preferably 1 μm or less, more preferably 0.8 μm or less, and even more preferably 0.6 μm or less, in view of obtaining a sintered body having a high level of density and a high level of hardness. The average particle size of the raw material powder can be measured using, for example, a method described below. Regarding the lower limit, the average particle size $D_{50}$ of the raw material powder is preferably, for example, 0.2 μm or more because the following advantages can be obtained: the raw material can be easily produced; and the shrinkage rate of the molded body will not be excessively large, so that a large sintered body can be easily produced. The average particle size $D_{50}$ is more preferably 0.3 μm or more.

The term "average particle size" refers to particle size measured before granulation in the case where molding is performed after granulation of the raw material powder.

Measurement of Average Particle Size

Microtrac MT3300 EXII available from Microtrac BEL Corporation was used. A powder sample was introduced into a 0.2 mass % hexametaphosphoric acid solution in pure water, until the apparatus determined that an appropriate concentration was reached, and the resultant was subjected to ultrasonication using the built-in device. Thereafter measurement was performed to obtain the value of $D_{50}$. The ultrasonication was performed at 40 W for 5 minutes.

For the composition of the raw material powder of the present invention, it is particularly preferable in the X-ray diffractometry using CuKα rays that the raw material powder contains orthorhombic $YAlO_3$ as the main phase, and that the ratio of S3 to S1, S3/S1, and the ratio of S4 to S1, S4/S1, are each independently less than 1, where S1 represents the intensity of the peak assigned to the (112) plane of orthorhombic $YAlO_3$, S3 represents the intensity of the peak assigned to the (420) plane of cubic crystal $Y_3Al_5O_{12}$, and S4 represents the intensity of the peak assigned to the (−221) plane of monoclinic crystal $Y_4Al_2O_9$. In view of further increasing the corrosion resistance to plasma etching with a halogen-based gas, in the raw material powder, S3/S1 and S4/S1 are each independently preferably 0.7 or less, more preferably 0.4 or less, and even more preferably 0.1 or less. It is most preferable that the peak assigned to the (420) plane of cubic crystal $Y_3Al_5O_{12}$ or the peak assigned to the (−221) plane of monoclinic crystal $Y_4Al_2O_9$ should not be exhibited.

From the same viewpoint, it is preferable to satisfy the following when the raw material powder is subjected to X-ray diffractometry: the maximum peak in a scan range of 20° to 60° is a peak assigned to $YAlO_3$, and simultaneously, among peaks assigned to the components of the raw material powder other than the composite oxide of yttrium and aluminum, the peak with the maximum height preferably has a relative peak height of 10 or less, more preferably 5 or less, and even more preferably 1 or less, to the peak height of the main peak assigned to $YAlO_3$, which is regarded as 100. It is most preferable that no peaks assigned to components other than the composite oxide of yttrium and aluminum should be exhibited. However, a sintering aid and a binder for use in granulation are excluded from the components other than the composite oxide of yttrium and aluminum. The main peak assigned to $YAlO_3$ in the raw material powder is preferably the peak assigned to the (112) plane of orthorhombic $YAlO_3$.

The raw material powder may exhibit a peak assigned to the composite oxide of yttrium and aluminum other than $YAlO_3$ in X-ray diffractometry, and in such a case, among the peaks assigned to the composite oxide of yttrium and aluminum other than orthorhombic $YAlO_3$, the peak with the maximum height preferably has a relative peak height of 70 or less, and more preferably 30 or less, to the height of the peak with the maximum height among the peaks assigned to orthorhombic $YAlO_3$, which is regarded as 100, in X-ray diffractometry of the raw material powder in a scan range of 20° to 60°, in view of obtaining a sintered body with a high level of mechanical strength. The composite oxide of yttrium and aluminum other than $YAlO_3$ may be $Y_3Al_5O_{12}$, $Y_4Al_2O_9$, or the like.

Step of Producing Raw Material Powder

For example, the above-described raw material powder may be produced by the following exemplary method. A mixture of an aluminum source and a yttrium source is calcined to obtain, as the raw material, a composite oxide of yttrium and aluminum containing perovskite $YAlO_3$ as the main phase. The aluminum source may be one or more selected from aluminum oxide, aluminum oxyhydroxide, aluminum hydroxide, aluminum carbonate, and basic aluminum carbonate. The yttrium source may be one or more selected from yttrium oxide, yttrium oxyhydroxide, yttrium hydroxide, and yttrium carbonate. The mixing ratio of the aluminum source and the yttrium source is preferably such that the amount of yttrium contained in the yttrium source is greater than 0.85 mol and 1.15 mol or less, per 1 mol of aluminum contained in the aluminum source. The calcination temperature is preferably 800° C. or more and 1550° C. or less, and more preferably 850° C. or more and 1500° C. or less, in view of ease of obtaining a desired composition and ease of pulverization in a subsequent step.

The composite oxide of yttrium and aluminum containing perovskite $YAlO_3$ as the main phase is subjected to wet pulverization to obtain a slurry containing particles with an average particle size of 1 μm or less. When a portion of the slurry at this time is dried to obtain a powder, the powder preferably has a BET specific surface area of 7 $m^2/g$ or more and 13 $m^2/g$ or less. With a BET specific surface area of 7 $m^2/g$ or more, it is possible to obtain a sufficient dense sintered body at a low temperature. With a BET specific surface area of 13 $m^2/g$ or less, the ratio of shrinkage (shrinkage rate) can be small when the molded body is sintered to obtain a sintered body so that the stress applied to the sintered body during production can be reduced, and accordingly, a large sintered body can be easily produced. From these viewpoints, the BET specific surface area of the raw material powder is more preferably 8 $m^2/g$ or more and 12 $m^2/g$ or less, and even more preferably 9 $m^2/g$ or more and 11 $m^2/g$ or less. In the case where the raw material powder is granulated before molding, the BET specific surface area of the raw material powder is measured before granulation. In the case where a binder for granulation and a sintering aid are added, the BET specific surface area of the raw material powder is measured before addition of these additives. The BET specific surface area can be measured using a BET single-point method. There is no particular limitation on the type of solvent, and for example, water and various types of organic solvents can be used.

In order to improve the processability in molding in the subsequent step, a binder and a plasticizer may be added as additives. Examples of the additives include PVA, PVB, a polyacrylate polymer, and a polycarboxylate copolymer. The components of the additives preferably decompose at 200° C. or more and 1000° C. or less.

The sufficiently pulverized slurry of the composite oxide of yttrium and aluminum containing YAP is dried to obtain a raw material powder for a molded body. For drying, any type of drying method can be used, such as stationary drying, hot air drying, freeze drying, or spray drying (spray dryer).

Molding Step

The above-obtained yttrium and aluminum raw material powder containing YAP is compressed in a mold to prepare a molded body. The molding can be performed using a die pressing method, a rubber pressing (hydrostatic pressing) method, a sheet molding method, an extrusion molding method, an injection molding method, or the like.

At this time, the molded body may contain additives that were added in the step of producing the raw material powder. Examples of the additives include a binder and a plasticizer, which are mentioned in the description for the process of producing a slurry, and also, paraffin wax and an acrylic resin. The amount of the additives in the raw material powder is preferably 7 mass % or less based on the amount of the composite oxide of yttrium and aluminum. When the amount of the additives is 7 mass % or less, it is possible to prevent the components of the additives from remaining in the sintered body during sintering in the subsequent step. From these viewpoints, the amount of the additives is more preferably 6 mass % or less, and even more preferably 5 mass % or less.

Particularly, in the case where pressureless sintering is performed in the sintering step, a pressure of 20 MPa or more and 200 MPa or less is preferably applied in the molding step. For example, it is preferable to perform hydrostatic molding by uniaxial pressing. In this case, the pressure applied is preferably 20 MPa or more in view of obtaining a highly dense sintered body. The pressure applied is preferably 200 MPa or less in view of reducing the wear of the apparatus and tools, and no improvement in density would be obtained even when a pressure higher than that is applied. From these viewpoints, the pressure applied during hydrostatic molding is more preferably 80 MPa or more and 140 MPa or less. The hydrostatic molding can be performed by hydraulic pressing using a mold, for example.

In the case where pressureless sintering is performed in the sintering step, die press molding by uniaxial pressing can also be performed in the molding step. In view of obtaining a highly dense sintered body, the pressure applied in this case is preferably 40 MPa or more, which is larger than that in hydrostatic molding. The pressure is preferably 200 MPa or less in view of reducing the wear of the apparatus and tools, and no improvement in density would be obtained even when a pressure higher than that is applied. The pressure applied during die press molding is more preferably 80 MPa or more and 140 MPa or less.

Sintering Step

The molded body obtained in the molding step is sintered in an air atmosphere or a controlled atmosphere. The sintering method includes a pressureless sintering method and a pressure sintering method. Examples of the pressure sintering method include hot pressing, spark plasma sintering (SPS), and hot isostatic pressing (HIP). The sintering temperature of the pressureless sintering is preferably 1400° C. or more and 1900° C. or less. When the sintering temperature is 1400° C. or more, the following advantages can be obtained: densification is likely to proceed, and decomposition and evaporation of the binder added also proceed. When the sintering temperature is 1900° C. or less, the following advantages can be obtained: melting of YAP can be suppressed, and the energy consumption of the electric oven can be suppressed. From these viewpoints, the sintering temperature is more preferably 1500° C. or more and 1700° C. or less.

In the case where pressure sintering is performed, sintering may be performed at a temperature of 1200° C. or more and 1700° C. or less under a pressure of 5 MPa or more and 100 MPa or less, for example.

It is unnecessary to subject the sintered body of the present invention to a post compaction step. Preferably, a sintered body produced using a specific method is excluded from the sintered body of the present invention, for example. The specific method is a method for producing a transparent ceramic object having a density exceeding 99% and an RIT exceeding 10% in a wavelength range of 300 nm to 4000 nm when the ceramic object has a thickness of 2 mm, the method including the steps of: producing a slip by dispersing a ceramic powder with an average particle size d50 of less than 5 μm; producing granules with an average particle size d50 of less than 1 mm from the slip through fluidized bed granulation; producing a green molded body by subjecting the granules to simple non-cyclic pressing; sintering the green molded body to obtain a sintered body; and subjecting the sintered body to post compaction. More preferably, a sintered body produced using the above-described method, wherein the sintered body is a transparent ceramic object having an RIT exceeding 10% in a wavelength range of 300 nm to 4000 nm (or 300 nm to 800 nm) when the ceramic object has a thickness of 2 mm, is exclude from the sintered body of the present invention. The average particle size d50 can be measured using the same method as described herein for the average particle size $D_{50}$; however, ultrasonication is not performed for measurement on granules.

The sintered body is preferably opaque. It is unnecessary for an opaque sintered body to strictly control factors of light-scattering (nonuniform grain boundaries and the presence of a different phase) while such control is necessary for transparent ceramics, and as a result, an opaque sintered body with a high level of plasma resistance can be provided at a relatively inexpensive cost. As used herein, the term "opaque" does not intend to mean that a sintered body in the form of a ceramic object having a thickness of 2 mm has an RIT of 10% or less at 300 nm to 4000 nm (or 300 nm to 800 nm), and the term also encompasses, for example, cases where when a sheet of paper with characters is covered with the ceramic object in a room at a light intensity of 500 lux to 1000 lux, the characters covered cannot be read. For example, sintered bodies obtained in Examples described later and sintered bodies obtained using the same method as that used in Examples are usually opaque when they have a thickness of 1 mm.

The sintered body of the present invention, which has a specific composition and a specific level of hardness, has a high level of thermal shock resistance and corrosion resistance to halogen-based plasma. Accordingly, the sintered body of the present invention is favorably used for a plasma-resistant member having a surface that is to be exposed to plasma in a halogen-based gas atmosphere, wherein the sintered body provides said surface. The plasma-resistant member is preferably a member that is to be exposed to plasma in the presence of a halogen-based corrosive gas, such as a fluorine-based gas or a chlorine-based gas, which is used in a plasma processing of semiconductors, and accordingly, the plasma-resistant member may also be referred to as "a member for a plasma processing apparatus". Specific examples of the plasma-resistant member include a chamber, such as a vacuum chamber, of a plasma etch equipment, and a member used in the chamber. Examples of the plasma-resistant member used in the chamber include a focus ring, a shower head, an electrostatic chuck, a top plate, a gas nozzle, and the like used when plasma etching is performed on a substrate or the like in a production process of semiconductor devices. Examples of the known halogen-based corrosive gas include, but not limited to, fluorine-based gases such as $SF_6$, $CF_4$, $CHF_3$, $ClF_3$, and HF, chlorine-based gases such as $Cl_2$, HCl, and $BCl_3$, bromine-based gases such as $Br_2$, HBr, and $BBr_3$, and iodine-based gases. The sintered body of the present invention is also applicable to constituent members of any type of plasma processing apparatus and a chemical plant, in addition to the member used in a semiconductor-manufacturing equipment and constituent members thereof. The surface that is to be exposed to plasma preferably has a surface roughness Ra of, for example, 2 nm to 2 μm. The surface roughness Ra can be measured using a stylus-type surface roughness tester (JIS B0651: 2001).

EXAMPLES

Hereinafter, the present invention will be described in further detail by way of examples. However, the scope of the present invention is not limited to the examples given below. In the examples given below, calcination is performed in an air atmosphere, unless otherwise stated.

The BET specific surface area of the powder contained in the slurry was obtained by the BET single-point method using, as the measurement apparatus, Macsorb available from Mountech Co., Ltd. A mixed gas containing 30 vol % of nitrogen and 70 vol % of helium was used as the measurement gas, and pure nitrogen was used as the calibration gas. 20 g of the slurry sample for measurement of the BET specific surface area was dried in an environment at 120° C. for 2 hours.

In the X-ray diffractometry of the sintered bodies of Examples and Comparative Examples performed under the condition described later, none of the following peaks was exhibited: a peak assigned to $YAlO_3$ phase other than orthorhombic $YAlO_3$, a peak assigned to $Y_3Al_5O_{12}$ phase other than cubic crystal $Y_3Al_5O_{12}$, a peak assigned to $Y_4Al_2O_9$ phase other than monoclinic crystal $Y_4Al_2O_9$, a peak assigned to $Al_2O_3$ phase other than trigonal $Al_2O_3$, a peak assigned to $Y_2O_3$ phase other than cubic crystal $Y_2O_3$.

Example 1

$Al_2O_3$($D_{50}$=0.4 μm) and $Y_2O_3$($D_{50}$=0.4 μm) were mixed at a molar ratio of $Al_2O_3$:$Y_2O_3$=1:1, and the mixture was calcined at 1400° C. for 5 hours to obtain a perovskite $YAlO_3$ powder, which was used as a raw material in a first step.

First Step

A 500 g/L $YAlO_3$ particle slurry was obtained by wet pulverizing 15 kg of the $YAlO_3$ powder together with pure water. The $YAlO_3$ particles after wet pulverization had an average particle size $D_{50}$ of 0.4 μm and a BET specific surface area of 10 $m^2$/g. The average particle size $D_{50}$ was obtained through measurement using Microtrac MT3300 EXII. The BET specific surface area was determined by collecting an aliquot of the slurry, drying the aliquot according to the above-described method, and subjecting the dried powder to measurement using the BET single-point method.

Second Step

An organic binder decomposable at 200° C. or more and 1000° C. or less was added as a binder to the slurry obtained in the first step such that the amount of the organic binder was about 5 mass % based on the amount of the composite oxide of yttrium and aluminum, and then, the mixture was sufficiently stirred until the binder was uniformly dispersed.

Third Step

The slurry obtained in the second step was granulated and dried using a spray dryer (available from Ohkawara Kakohki Co., Ltd.) to obtain a granulated product. The spray dryer was operated under the following condition to obtain the granulated product.

Feed rate of slurry: 75 mL/min

Rotation speed of atomizer: 12500 rpm

Temperature of inlet: 250° C.

Fourth Step

Molded bodies were each obtained by introducing the $YAlO_3$ powder (granulated product) obtained in the third step into a molding die with φ 50 mm, and then uniaxially molding the $YAlO_3$ powder at a pressure of 100 MPa by a hydraulic press.

Fifth Step

Sintered bodies were each obtained by placing the $YAlO_3$ molded body obtained in the fourth step on a $Y_2O_3$ plate, and calcining the $YAlO_3$ molded body in an air atmosphere in an electric oven. The final calcination temperature was 1650° C., and the calcination duration was 5 hours.

In the fourth step, 30 molded bodies were prepared. In the fifth step, 30 sintered bodies were obtained by calcining the 30 molded bodies.

Evaluation of Sintered Body

Each of the sintered bodies obtained in Examples was evaluated using the following method.

Composition

Each sintered body was subjected to XRD. The XRD was performed under the following condition. For the XRD, the sintered body was directly inserted into the site for attaching a sample holder on the standard sample stage. From the obtained X-ray diffraction pattern, relative intensities were calculated for the peak assigned to the (112) plane of orthorhombic $YAlO_3$, the peak assigned to the (420) plane of cubic crystal $Y_3Al_5O_{12}$, the peak assigned to the (−221) plane of monoclinic crystal $Y_4Al_2O_9$, the peak assigned to the (104) plane of trigonal $Al_2O_3$, and the peak assigned to the (222) plane of cubic crystal $Y_2O_3$. The results are shown in Table 1. Peaks assigned to components other than $YAlO_3$, $Y_3Al_5O_{12}$, $Y_4Al_2O_9$, $Al_2O_3$, or $Y_2O_3$ were not exhibited.

X-Ray Diffractometry

Apparatus: Ultima IV (available from Rigaku Corporation)

Ray source: CuKα rays

Tube voltage: 40 kV

Tube current: 40 mA

Scan speed: 2°/min

Step: 0.020

Scan range: 2θ=200 to 60°

Density and Open Porosity

Density and open porosity were determined using an Archimedes method. Specifically, dry weight (W1), weight when submerged in water (W2), and weight when saturated with water (W3) were measured using precision electronic balance AUX320 available from Shimadzu Corporation, and the density (g/cm$^3$) and the open porosity (mass %) were obtained using the following equations.

$$\text{Density}=W1/(W3-W2)$$

$$\text{Open Porosity}=(W3-W1)/(W3-W2)\times 100$$

Vickers Hardness

A sample was obtained by roughly polishing a sintered body and thereafter polishing the resulting sintered body with a diamond slurry having an average particle size of 0.05 μm. The obtained sample was subjected to Vickers hardness measurement in accordance with JIS R1610. For the measurement, a Vickers hardness tester MVK-G1 (available from Akashi Seisakusho, Ltd.) was used. In the Vickers hardness test, the load was 100 gf (0.980665 N), and an indentation defined in JIS R1610 4.6.11 was used. The holding time was 15 seconds. The measurement was performed at 10 points, and the average value was obtained. The indentation was observed under an optical microscope to measure the size of the indentation. Vickers hardness HV [MPa] was calculated using the following equation:

$$HV=(0.1891\ F)/d^2\ (\text{MPa})$$

where F represents test load [N], and d represents the average of diagonal lengths of indentations [mm].

Average Crystal Grain Size

Average Crystal Grain Size (Crystal Grain Size)

The average crystal grain size was measured using an intercept method. In the intercept method, straight lines are drawn on a scanning electron microscope (SEM) image, the length of a straight line that traverses one particle is defined as the crystal grain size, and the average value of the crystal grain sizes is defined as the average crystal grain size. On the SEM image (photographic image), five straight lines are diagonally drawn in parallel. The five straight lines are drawn at positions determined by dividing a distance into six equal parts, wherein the distance is a distance between two mutually facing corners in the other diagonal direction, which crosses the diagonal direction parallel to the straight lines in the rectangular SEM image (photographic image). Each of the straight lines are drawn from the grain boundary closest to one end of an image to the grain boundary closest to the other end of the image. This operation is performed in two different observation fields. The total length of the ten straight lines in total of the two observation fields and the number of intersections with grain boundaries are obtained, and they are used to calculate the average crystal grain size using Equation 1. Note that two opposite ends of a straight line are not counted as the number of intersections.

Average crystal grain size=total length of ten straight lines in total of two observation fields/(total number of straight lines in two observation fields+total number of intersections with grain boundaries in ten straight lines in total of two observation fields) (Equation 1)

The magnification of an SEM image is set such that 10 to 30 crystal grains can be observed in the image (provided that only crystal grains the entirety of which is observed in the image are counted, and crystal grains a portion of which is missing and not observed are not counted).

Figure 2:
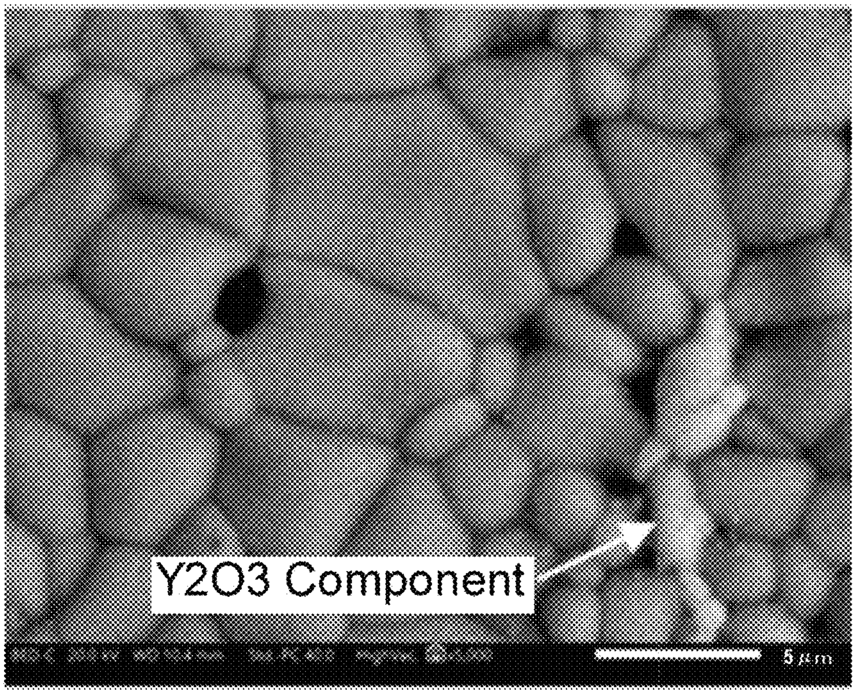
FIG. 2 is a scanning electron microscope image of a sintered body obtained in Comparative Example 3.

A sample was broken to obtain a cross section, mirror-polished on the cross section, then calcined in an argon atmosphere, and subjected to thermal etching. The calcination temperature was set to 1500° C., taking the melting point of the sintered body into account. The holding duration was 5 hours. Then, the etched surface was captured using an SEM to obtain an image. FIG. 1 shows the SEM image of the sintered body of Example 1, and FIG. 2 shows the SEM image of the sintered body of Comparative Example 3.

Number Density of Atoms

The number density of yttrium (Y) atoms was calculated from the composition and the density. In the case where diffraction peaks assigned to components other than the main phase were exhibited in X-ray diffractometry, component analysis of $Y_2O_3$ and $Al_2O_3$ was performed by XRF spectroscopy to obtain the ratio of each component, and the number density of yttrium (Y) atoms was obtained on the basis of the ratios. For the XRF spectroscopy, oxide calculation mode of ZSX primus II available from Rigaku Corporation was used.

Temperature of Thermal Shock Fracture

A sintered body with a size of φ 40 mm×5 mm was used for evaluation. The test temperatures were as follows: 110° C., 120° C., 130° C., 140° C., 150° C., 160° C., 170° C., 180° C., 190° C., and 200° C. For each test temperature, two sintered bodies were provided. Each of the sintered bodies was placed and heated in an oven at a predetermined test temperature for 5 hours, and thereafter, the heated sintered body was introduced into water at 4° C.±1° C. The maximum temperature at which no cracks were produced in at least one of the sintered bodies was defined as "temperature of thermal shock fracture".

Measurement of Surface Roughness Before and After Irradiation with Plasma

One side of a sintered body cut into 20 mm×20 mm×2 mm (thickness) was mirror polished, and then surface roughness was measured for the mirror polished surface.

The sample, whose surface roughness had been measured for the mirror polished surface, was placed in a chamber of etch equipment (RIE-10NR available from Samco Inc.), with the mirror polished surface facing upward, and subjected to plasma etching, and the surface roughness of the sample after irradiation was then measured. The plasma etching was performed under the conditions described blow. As the surface roughness, the arithmetic average roughness (Ra) was obtained using a stylus-type surface roughness tester (JISB0651: 2001). As the stylus-type surface roughness tester, a stylus profiler P-7 available from KLA-Tencor Corporation was used. The arithmetic average roughness (Ra) was measured under the following condition: evaluation length 5 mm, and measurement speed 100 m/s. The average value of found values at 3 points was obtained as Ra.

Plasma Etching Condition

Atmospheric gas: $CF_4/O_2/Ar$=15/30/20 (cc/min)
High frequency power: RF 300 W
Pressure: 5 Pa
Etching Duration: 4 hours

Example 2

Sintered bodies were obtained and evaluated in the same manner as in Example 1, except that the calcination temperature in the fifth step was changed to 1600° C. In the X-ray diffractometry of the obtained sintered bodies, peaks assigned to components other than $YAlO_3$, $Y_3A_{15}O_2$, $Y_4Al_2O_9$, $Al_2O_3$, or $Y_2O_3$ were not exhibited.

Example 3

Sintered bodies were obtained and evaluated in the same manner as in Example 1, except that the calcination temperature in the fifth step was changed to 1550° C. In the X-ray diffractometry of the obtained sintered bodies, peaks assigned to components other than $YAlO_3$, $Y_3Al_5O_{12}$, $Y_4Al_2O_9$, $Al_2O_3$, or $Y_2O_3$ were not exhibited.

Example 4

$Al_2O_3$($D_{50}$=0.4 μm) and $Y_2O_3$($D_{50}$=0.4 μm) were mixed at a molar ratio of $Al_2O_3$. $Y_2O_3$=10:11, and the mixture was calcined at 1400° C. for 5 hours to obtain a composite oxide powder, which was used as the raw material in the first step instead of the $YAlO_3$ powder used in Example 1. The composite oxide powder was subjected to X-ray diffractometry under the above-described condition, and it was found that the composite oxide powder exhibited a peak assigned to the (210) plane of orthorhombic $YAlO_3$ and a peak assigned to the (−221) plane of monoclinic crystal $Y_4Al_2O_9$, and the ratio between the intensities of the two peaks was $YAlO_3$. $Y_4Al_2O_9$=100:14. Also, the composite oxide powder after wet pulverization had an average particle size $D_{50}$ of 0.4 m, as determined through measurement using Microtrac MT 3300 EXII. The BET specific surface area of the composite oxide powder was determined by collecting an aliquot of the slurry, drying the aliquot according to the above-described method, and subjecting the dried powder to measurement using the BET single-point method, and as a result, the BET specific surface area was found to be 9 $\mu m^2$/g.

Sintered bodies were obtained and evaluated in the same manner as in Example 1, except for the above-described changes. In the X-ray diffractometry of the obtained sintered bodies, peaks assigned to components other than $YAlO_3$, $Y_3Al_5O_{12}$, $Y_4Al_2O_9$, $Al_2O_3$, or $Y_2O_3$ were not exhibited.

Example 5

$Al_2O_3$($D_{50}$=0.4 μm) and $Y_2O_3$($D_{50}$=0.4 μm) were mixed at a molar ratio of $Al_2O_3$. $Y_2O_3$=11:10, and the mixture was calcined at 1400° C. for 5 hours to obtain a composite oxide powder, which was used as the raw material in the first step instead of the $YAlO_3$ powder used in Example 1. The composite oxide powder was subjected to X-ray diffractometry under the above-described condition, and it was found that the composite oxide powder exhibited a peak assigned to the (112) plane of orthorhombic $YAlO_3$ and a peak assigned to the (420) plane of cubic crystal $Y_3Al_5O_{12}$, and the ratio between the intensities of the two peaks was $YAlO_3$. $Y_3Al_5O_{12}$=100:15. Also, the composite oxide powder after wet pulverization had an average particle size $D_{50}$ of 0.4 m, as determined through measurement using Microtrac MT 3300 EXII. The BET specific surface area of the composite oxide powder was determined by collecting an aliquot of the slurry, drying the aliquot according to the above-described method, and subjecting the dried powder to measurement using the BET single-point method, and as a result, the BET specific surface area was found to be 10 $m^2$/g.

Sintered bodies were obtained and evaluated in the same manner as in Example 1, except for the above-described changes. In the X-ray diffractometry of the obtained sintered bodies, peaks assigned to components other than $YAlO_3$, $Y_3Al_5O_{12}$, $Y_4Al_2O_9$, $Al_2O_3$, or $Y_2O_3$ were not exhibited.

Comparative Example 1

Sintered bodies were obtained and evaluated in the same manner as in Example 1, except that $Y_2O_3$ powder was used as the raw material in the first step instead of the $YAlO_3$ powder used in Example 1. The $Y_2O_3$ powder after wet pulverization had an average particle size $D_{50}$ of 0.5 μm, as determined through measurement using Microtrac MT 3300 EXII.

Comparative Example 2

Sintered bodies were obtained and evaluated in the same manner as in Example 1, except that $Y_3Al_5O_{12}$ powder was used as the raw material in the first step instead of the $YAlO_3$ powder used in Example 1. The $Y_3Al_5O_{12}$ powder after wet pulverization had an average particle size $D_{50}$ of 0.4 μm, as determined through measurement using Microtrac MT 3300 EXII.

Comparative Example 3

This comparative example corresponds to US 2003/0049499A1. 4.7 kg of $Al_2O_3$ powder and 10.3 kg of $Y_2O_3$ powder were used as the raw material in the first step instead of the $YAlO_3$ powder used in Example 1. The wet-pulverized raw material powder (a mixed powder obtained by mixing $Al_2O_3$ and $Y_2O_3$ and wet pulverizing the mixture) had an average particle size $D_{50}$ of 0.5 μm, as determined through measurement using Microtrac MT 3300 EXII. Sintered bodies were obtained and evaluated in the same manner as in Example 1, except for the above-described changes. In the X-ray diffractometry of the obtained sintered bodies, peaks assigned to components other than $YAlO_3$, $Y_3Al_5O_{12}$, $Y_4Al_2O_9$, $Al_2O_3$, or $Y_2O_3$ were not exhibited.

Comparative Example 4

Sintered bodies were obtained and evaluated in the same manner as in Comparative Example 3, except that the calcination temperature in the fifth step was changed to 1550° C. In the X-ray diffractometry of the obtained sintered bodies, peaks assigned to components other than $YAlO_3$, $Y_3Al_5O_{12}$, $Y_4Al_2O_9$, $Al_2O_3$, or $Y_2O_3$ were not exhibited.

which contained a conventionally used corrosion-resistant material, specifically, YAG, and the sintered bodies of Comparative Examples 3 and 4, which contained YAP as the main phase but did not satisfy the specific value of Vickers hardness. Thus, it can be seen that the sintered bodies of Examples have an excellent level of anti-plasma corrosion in the presence of a halogen gas.

INDUSTRIAL APPLICABILITY

The present invention provides a sintered body that contains, as the main phase, YAP, which contains a larger amount of Y component than YAG and thus can improve resistance to halogen-based plasma as compared with YAG, and that has a more excellent level of thermal shock resistance than conventional sintered bodies. Also, the present invention provides a method for producing the above-described sintered body conveniently.

The invention claimed is:

1. A sintered body containing perovskite $YAlO_3$ as a main phase,

TABLE 1

| | Main phase | Relative peak intensity in X-ray diffractometry: $YAlO_3$ (S1) | $Al_2O_3$ (S2) | $Y_3Al_5O_{12}$ (S3) | $Y_4Al_2O_9$ (S4) | $Y_2O_3$ (S5) | Density [g/cm$^3$] | Open porosity [%] | Vickers hardness [GPa] | Average crystal grain size [μm] | Number density of atoms Y [/cm$^3$] | Temperature of thermal shock fracture [° C.] | Ra [nm] Before irradiation with plasma | Ra [nm] After irradiation with plasma |
|---|---|---|---|---|---|---|---|---|---|---|---|---|---|---|
| Ex. 1 | $YAlO_3$ | 100 | 0 | 0 | 0 | 0 | 5.3 | 0.0 | 14 | 4 | $2.0 \times 10^{22}$ | 160 | 5 | 10 |
| Ex. 2 | | 100 | 0 | 0 | 0 | 0 | 5.2 | 0.0 | 14 | 3 | $1.9 \times 10^{22}$ | 160 | 4 | 12 |
| Ex. 3 | | 100 | 0 | 0 | 0 | 0 | 5.1 | 0.1 | 13 | 1 | $1.9 \times 10^{22}$ | 150 | 6 | 19 |
| Ex. 4 | | 100 | 0 | 0 | 14 | 0 | 5.1 | 0.0 | 12 | 7 | $2.0 \times 10^{22}$ | 150 | 3 | 22 |
| Ex. 5 | | 100 | 0 | 15 | 0 | 0 | 5.2 | 0.0 | 13 | 5 | $1.8 \times 10^{22}$ | 150 | 4 | 25 |
| Comp. Ex. 1 | $Y_2O_3$ | 0 | 0 | 0 | 0 | 100 | 5.0 | 0.0 | 6 | 4 | $2.6 \times 10^{22}$ | 130 | 3 | 35 |
| Comp. Ex. 2 | $Y_3Al_5O_{12}$ | 0 | 0 | 100 | 0 | 0 | 4.4 | 0.1 | 13 | 5 | $1.1 \times 10^{22}$ | 120 | 4 | 48 |
| Comp. Ex. 3 | $YAlO_3$ | 100 | 0 | 0 | 0 | 1 | 5.0 | 0.1 | 10 | 6 | $1.8 \times 10^{22}$ | 130 | 5 | 32 |
| Comp. Ex. 4 | | 100 | 0 | 4 | 0 | 3 | 4.8 | 2.0 | 8 | 2 | $1.7 \times 10^{22}$ | 110 | 11 | 52 |

As can be seen from Table 1, the sintered bodies of Examples, which contained $YAlO_3$ (YAP) as the main phase and had a Vickers hardness of 11 GPa or more, exhibit a high level of halogen-based plasma resistance resulting from the high number density of atoms of yttrium (Y), and also have a high temperature of thermal shock fracture and therefore an excellent level of thermal shock resistance.

On the other hand, it can be seen that the sintered bodies of Comparative Examples 1 and 2, which contained $Y_2O_3$ and YAG, respectively, as the main phase, exhibit a poor level of thermal shock resistance, and that the sintered bodies of Comparative Examples 3 and 4, which contained YAP as the main phase but did not satisfy the specific value of Vickers hardness, also exhibit a poor level of thermal shock resistance. In the sintered bodies of Examples, changes in surface roughness Ra in the plasma etching irradiation test are suppressed, as compared with any of the sintered bodies of Comparative Example 1, which contained $Y_2O_3$ and had a density of yttrium (Y) higher than that in Examples, the sintered bodies of Comparative Example 2, wherein, in X-ray diffractometry in a scan range of $2\Theta=20°$ to $60°$ using Cuk $\alpha$ rays, a peak assigned to the (420) plane of cubic crystal $Y_3Al_5O_{12}$ or a peak assigned to the (−221) plane of monoclinic crystal $Y_4Al_2O_9$ is exhibited, a value of a ratio of S3 to S1, S3/S1, and a value of a ratio of S4 to S1, S4/S1, are each 0.7 or less, where S1 represents an intensity of a peak assigned to the (112) plane of orthorhombic $YAlO_3$, S3 represents an intensity of the peak assigned to the (420) plane of cubic crystal $Y_3Al_5O_{12}$, and S4 represents an intensity of the peak assigned to the (−221) plane of monoclinic crystal $Y_4Al_2O_9$, a maximum peak assigned to a component other than $YAlO_3$, $Y_3Al_5O_{12}$, or $Y_4Al_2O_9$ has a relative peak height of 10 or less to a peak height of the peak assigned to the (112) plane of orthorhombic $YAlO_3$, which is regarded as 100, a peak assigned to the (222) plane cubic crystal $Y_2O_3$ is not exhibited, a peak assigned to the (104) plane of trigonal $Al_2O_3$ is not exhibited, the sintered body has a Vickers hardness of 11 GPa or more, and the sintered body has an open porosity of 0.01% or less.

2. The sintered body according to claim 1, wherein the sintered body has a density of 5.1 g/cm$^3$ or more.

3. The sintered body according to claim 1, wherein the sintered body has an average crystal grain size of 10 μm or less.

4. A method for producing the sintered body according to claim 1, the method comprising the steps of:

preparing a molded body made of a raw material powder that contains $YAlO_3$ and has an average particle size of 1 μm or less; and sintering the molded body at a temperature of 1200° C. or more and 1700° C. or less under a pressure of 5 MPa or more and 100 MPa or less to obtain the sintered body.

5. A method for producing the sintered body according to claim 1, the method comprising the steps of:

molding a raw material powder that contains $YAlO_3$ and has an average particle size of 1 μm or less at a pressure applied of 20 MPa or more and 200 MPa or less to obtain a molded body; and sintering the molded body at a temperature of 1400° C. or more and 1900° C. or less without applying a pressure.

6. The method according to claim 4, wherein the raw material powder that contains $YAlO_3$ and has an average particle size of 1 μm or less has a BET specific surface area of 7 m$^2$/g or more and 13 m$^2$/g or less.

7. A plasma-resistant member having a surface that is to be exposed to plasma in a halogen-based gas atmosphere, wherein the sintered body according to claim 1 provides said surface.

* * * * *